US012677619B2

(12) United States Patent
Nakamura et al.

(10) Patent No.: US 12,677,619 B2
(45) Date of Patent: Jul. 7, 2026

(54) METHOD OF MANUFACTURING SILICON CARBIDE SEMICONDUCTOR DEVICE

(71) Applicant: FUJI ELECTRIC CO., LTD., Kawasaki (JP)

(72) Inventors: Hidetatsu Nakamura, Matsumoto-city (JP); Keiji Okumura, Matsumoto-city (JP); Yoshikuni Fujimoto, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 1136 days.

(21) Appl. No.: 17/706,743

(22) Filed: Mar. 29, 2022

(65) Prior Publication Data

US 2022/0367274 A1     Nov. 17, 2022

(30) Foreign Application Priority Data

May 17, 2021     (JP) ................................. 2021-083247

(51) Int. Cl.
        *H10P 54/00*        (2026.01)
        *H10D 30/63*        (2025.01)
        *H10D 62/832*       (2025.01)
(52) U.S. Cl.
        CPC ............. *H10P 54/00* (2026.01); *H10D 30/63* (2025.01); *H10D 62/8325* (2025.01)
(58) Field of Classification Search
        CPC ........... H01L 21/78; H01L 2223/54426; H01L 22/12; H01L 23/544; H01L 22/32;
                        (Continued)

(56) References Cited

U.S. PATENT DOCUMENTS

2019/0172757 A1* 6/2019 Tsuchiya .............. G01N 21/956
2021/0242148 A1* 8/2021 Maurer ................... H01L 24/05
                        (Continued)

FOREIGN PATENT DOCUMENTS

JP        2014022503 A        2/2014
JP        2015207595 A        11/2015
                        (Continued)

OTHER PUBLICATIONS

Japanese Office Action dated Jan. 14, 2025, in the counterpart of Japanese Patent Application No. 2021-083247.

*Primary Examiner* — Sue A Purvis
*Assistant Examiner* — Carnell Hunter, III
(74) *Attorney, Agent, or Firm* — Rabin & Berdo, P.C.

(57)            ABSTRACT

A method of manufacturing a silicon carbide semiconductor device. The method includes epitaxially growing an epitaxial layer on a starting substrate to form a semiconductor wafer, forming a plurality of scribe lines, including a first scribe line, in the epitaxial layer, forming a mark in the first scribe line, inspecting the epitaxial layer for a crystal defect using crystal defect inspection equipment, which recognizes the first scribe line as being a second scribe line, forming a device element structure in the semiconductor wafer, dicing the semiconductor wafer into semiconductor chips along the scribe lines, and identifying, as a conforming product candidate, one of the semiconductor chips that is free of the crystal defect detected during the inspecting. A distance between an edge of the second scribe line and an edge of the mark, when the first and second scribe lines are aligned, is in a range from 10 μm to 25 μm.

6 Claims, 11 Drawing Sheets

50

51(30)

53

61

54

<1-100>
DIRECTION

<11-20> DIRECTION

(58) Field of Classification Search
CPC ..... H01L 21/3043; H01L 22/20; H10D 30/63;
H10D 62/8325; H10D 30/665; H10D
62/107; H10D 62/157; H10D 62/393;
H10D 62/405; H10D 12/481; H10D
30/668; H10D 12/031
See application file for complete search history.

(56) References Cited

U.S. PATENT DOCUMENTS

| | | | | |
|---|---|---|---|---|
| 2023/0207392 A1* | 6/2023 | Ota | ...................... | H10D 64/112 257/77 |
| 2023/0238296 A1* | 7/2023 | Nishimura | .............. | H10P 54/00 257/620 |
| 2023/0369411 A1* | 11/2023 | Sakurada | ................ | C30B 29/36 |

FOREIGN PATENT DOCUMENTS

| | | |
|---|---|---|
| JP | 2016-134427 A | 7/2016 |
| WO | 2018/029786 A1 | 2/2018 |

* cited by examiner

FIG.4

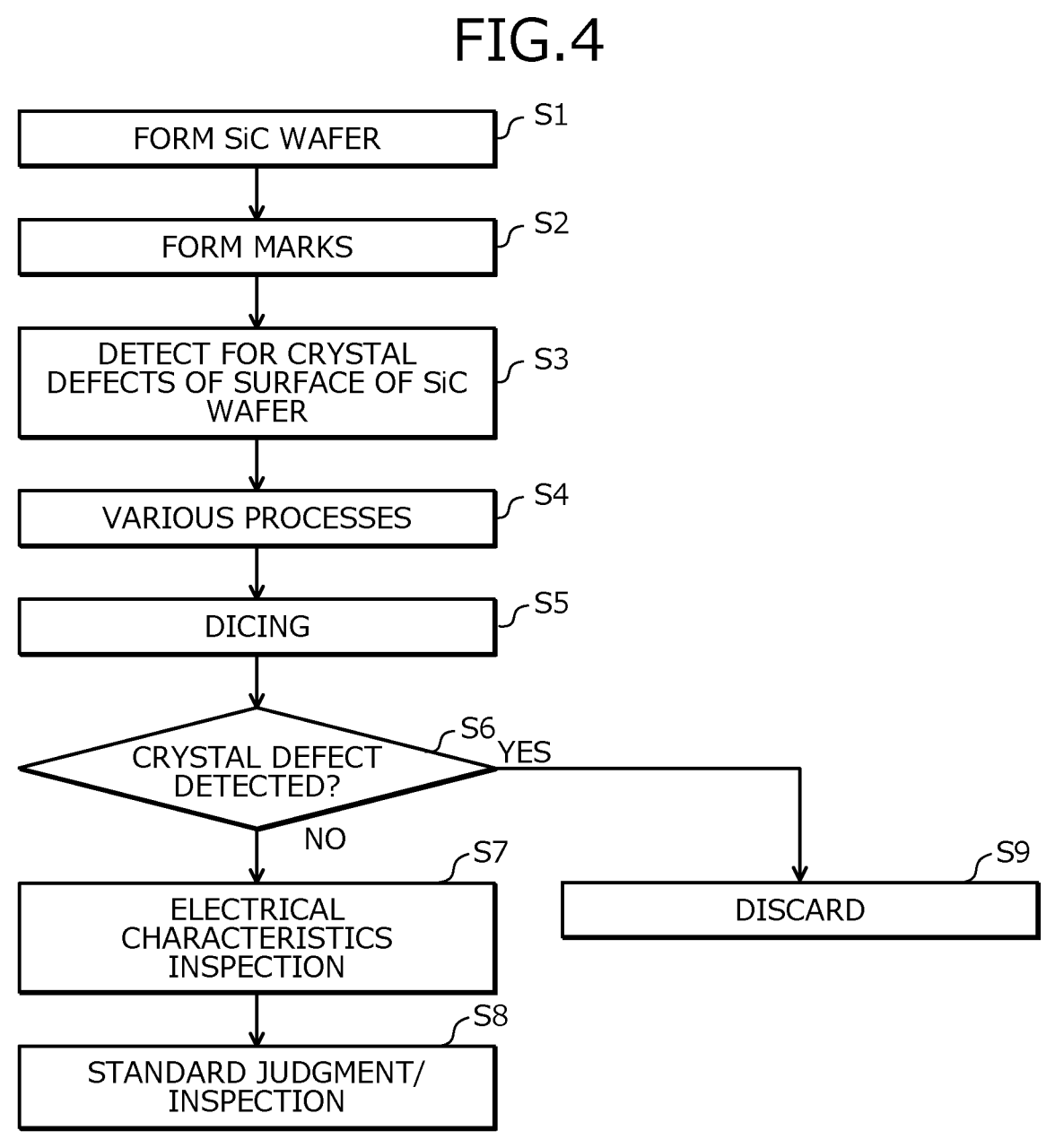

FORM SiC WAFER — S1

FORM MARKS — S2

DETECT FOR CRYSTAL DEFECTS OF SURFACE OF SiC WAFER — S3

VARIOUS PROCESSES — S4

DICING — S5

CRYSTAL DEFECT DETECTED? — S6

YES

NO

ELECTRICAL CHARACTERISTICS INSPECTION — S7

DISCARD — S9

STANDARD JUDGMENT/ INSPECTION — S8

<1-100>
DIRECTION

<11-20> DIRECTION

<1-100>
DIRECTION

<11-20> DIRECTION

METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-083247, filed on May 17, 2021, the entire contents of which are incorporated herein by reference.

BACKGROUND OF THE INVENTION

1. Field of the Invention

Embodiments of the invention relate to a method of manufacturing a silicon carbide semiconductor device.

2. Description of the Related Art

Conventionally, to evaluate the reliability of a silicon carbide semiconductor device (semiconductor chip) that contains silicon carbide (SiC) as a semiconductor material, crystal defects of surfaces and inside a semiconductor wafer (SiC wafer) are detected by crystal defect inspection equipment (for example, the SiC Wafer Inspection and Review System SICA88 manufactured by Lasertec Corporation), whereby a non-conforming chip among individual semiconductor chips cut from the semiconductor wafer is identified. All semiconductor chips containing crystal defects detected by the crystal defect inspection equipment are regarded to be non-conforming chips without exception, regardless of results of an electrical characteristics test or without performing the electrical characteristics test.

A method of manufacturing a conventional silicon carbide semiconductor device is described. FIG. 11 is a flowchart of an outline of the method of manufacturing the conventional silicon carbide semiconductor device. First, a semiconductor wafer (SiC wafer) containing silicon carbide as a semiconductor material is prepared (step S101). The semiconductor wafer is an epitaxial wafer in which an epitaxial layer is epitaxially grown on a starting wafer containing silicon carbide. Next, on the surface of the epitaxial layer of the semiconductor wafer (main surface), a mark for indicating locations (coordinates in directions parallel to the wafer surface) of crystal defects of the semiconductor wafer and/or manufacturing process alignment are formed (step S102).

Next, crystal defects of the epitaxial layer of the semiconductor wafer are detected by the crystal defect inspection equipment and based on the marks formed by the process at step S102, location information, etc. of the crystal defects is obtained (step S103). In the process at step S103, downfalls and large pits caused by foreign particle contamination, carbon (C) inclusions, etc.; triangular defects caused by polymorphic inclusions (crystalline polymorphs); and Frank dislocations and carrot defects caused by threading screw dislocations (TSDs) generated during epitaxial growth of the epitaxial layer are detected.

Next, in each chip region (region constituting a semiconductor chip) of the semiconductor wafer, various processes for forming a predetermined device element structure are performed (step S104). Next, the semiconductor wafer is cut (diced), whereby each of the chip regions of the semiconductor wafer becomes an individual semiconductor chip (SiC chip) (step S105). Next, based on the location information obtained by the process at step S103, a semiconductor chip completely free of the crystal defects detected by the process at step S103 is identified as a conforming product (conforming chip) candidate (step S106). A semiconductor chip containing even one crystal defect detected by the process at step S103 is removed as a non-conforming chip.

Next, for each semiconductor chip identified as a conforming product candidate by the process at step S106, a predetermined conduction test is performed and electrical characteristics are inspected (step S107), and based on the results at step S107, it is determined whether a conforming product standard obtained in advance is satisfied (step S108). A conforming product standard is a limit value of any of various characteristics capable of ensuring a predetermined capability and predetermined reliability of the silicon carbide semiconductor device; the conforming product standard is obtained in advance. Thereafter, based on the results at step S108, semiconductor chips satisfying the conforming product standard are identified as conforming products (conforming chips) (step S109), whereby evaluation of the silicon carbide semiconductor device is completed.

As a method of manufacturing a conventional silicon carbide semiconductor device, in an instance of an external appearance inspection in which the size of a chip is greater than the size of the field of view of a camera and the chip is divided into and photographed in sections, a method of performing the external appearance inspection by cutting out an inspection image from the photographed image based on the position of an alignment pattern to prevent an occurrence of pseudo-defects has been proposed (for example, refer to International Publication No. WO 2018/029786). Further, as a conventional semiconductor wafer, a semiconductor wafer has been proposed in which the occurrence of chipping and cracking is reduced by disposing, of first and second scribe lines that are orthogonal to each other, the first scribe line in a direction parallel to a cleavage direction of the crystal of the substrate and disposing an accessory pattern concentrated at a position overlapping a laser irradiation region for stealth dicing (for example, refer to Japanese Laid-Open Patent Publication No. 2016-134427).

SUMMARY OF THE INVENTION

According to an embodiment of the invention, a method of manufacturing a silicon carbide semiconductor device includes providing a starting substrate containing silicon carbide; epitaxially growing an epitaxial layer on the starting substrate, thereby forming a semiconductor wafer; forming a plurality of scribe lines, which include a first scribe line, in the epitaxial layer, to thereby delineate a plurality of chip regions; forming a mark in the first scribe line; inspecting the epitaxial layer for a crystal defect using crystal defect inspection equipment, the crystal defect inspection equipment recognizing the plurality of scribe lines to be a plurality of recognized scribe lines, including recognizing the first scribe line to be a second scribe line; forming a device element structure in at least one of the plurality of chip regions in the semiconductor wafer; dicing the semiconductor wafer into a plurality of individual semiconductor chips along the plurality of scribe lines, after the device element structure is formed; and identifying, as a conforming product candidate, one of the plurality of semiconductor chips that is free of the crystal defect detected during the inspecting. A distance between an edge of the second scribe line and an edge of the mark, when the second scribe line and the first scribe line are aligned, is in a range from 10 μm to 25 μm.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a flowchart of an outline of the method of manufacturing the silicon carbide semiconductor device according to the first embodiment.

FIG. 8 is a top view of the mark in the scribe lines of the semiconductor wafer according to the first embodiment and a linear crystal defect.

FIG. 9 is a top view in an instance in which the mark 62 is disposed in a dedicated chip-disposal-region.

FIG. 10 is a top view in an instance in which the mark 62 is disposed in a dead region 53.

DETAILED DESCRIPTION OF THE INVENTION

Figure 12:
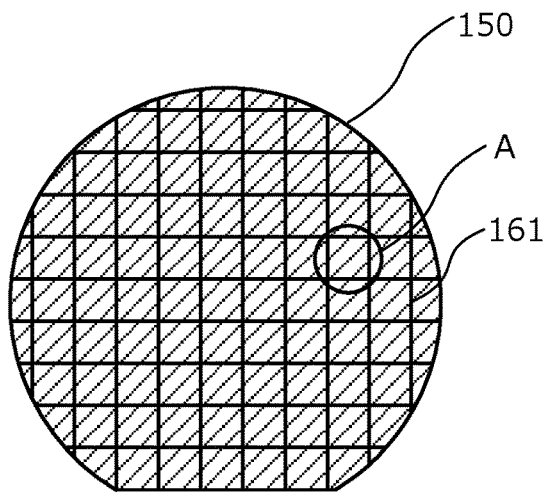
FIG. 12 is a top view of a conventional semiconductor wafer.
Figure 13:
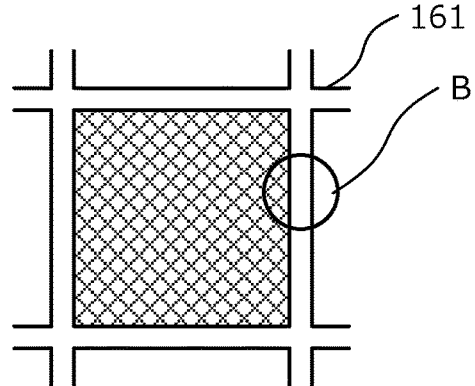
FIG. 13 is a top view of scribe lines of the conventional semiconductor wafer.

First, problems associated with the conventional techniques are discussed. FIG. 12 is a top view of a conventional semiconductor wafer. A semiconductor wafer 150 has scribe lines 161 that indicate cutting locations when the semiconductor wafer 150 is cut into individual semiconductor chips. FIG. 13 is a top view of the scribe lines of the conventional semiconductor wafer. FIG. 13 is an enlarged view of a portion A in FIG. 12.

Figure 14:
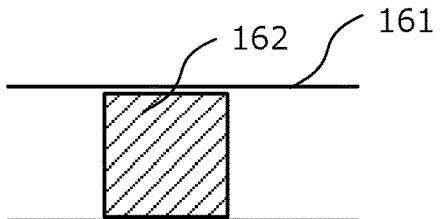
FIG. 14 is a top view of a mark in a scribing line of the conventional semiconductor wafer.

FIG. 14 is a top view of a mark in a scribing line of the conventional semiconductor wafer. FIG. 14 is an enlarged view of a portion B in FIG. 13. The semiconductor wafer 150 has marks 162 for indicating locations of crystal defects in semiconductor wafer 150, manufacturing process alignment, etc. The marks 162 are provided in the scribe lines 161.

Figure 15:
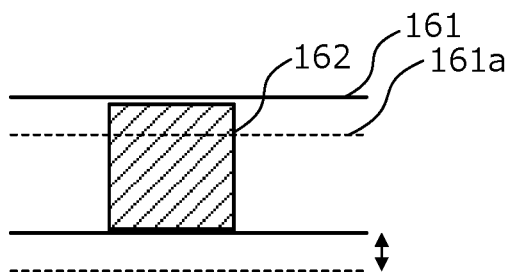
FIG. 15 is a top view depicting a scribe line of the conventional semiconductor wafer and a scribe line recognized by the crystal defect inspection equipment.

When the crystal defect inspection equipment detects for crystal defects, the crystal defect inspection equipment is set to recognize the locations of the scribe lines 161 and to not perform the inspection at those locations. FIG. 15 is a top view depicting a scribe line of the conventional semiconductor wafer and a scribe line recognized by the crystal defect inspection equipment. Nonetheless, as depicted in FIG. 15, the scribe lines 161 provided in the semiconductor wafer 150 and scribe lines 161a recognized by the crystal defect inspection equipment do not completely match and misalignment occurs.

Figure 16:
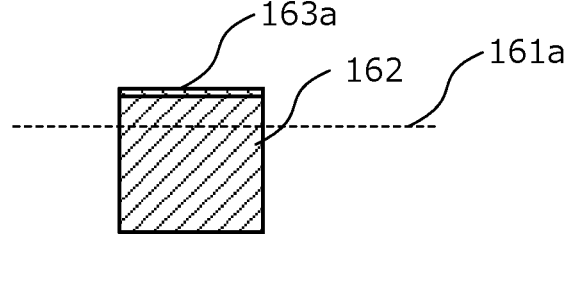
FIG. 16 is a top view in an instance in which a mark in a scribe line of the conventional semiconductor wafer is recognized as a defect.

FIG. 16 is a top view in an instance in which a mark in a scribe line of the conventional semiconductor wafer is recognized as a defect. When misalignment occurs, the crystal defect inspection equipment may misrecognize (erroneously recognize) a mark edge-portion 163a of the mark 162 to be a crystal defect because the shape thereof resembles a shape of a crystalline linear defect called an edge line, which extends in a direction parallel to an orientation flat of the semiconductor wafer 150.

As a result, in the method of manufacturing the conventional silicon carbide semiconductor device described above, a chip that is actually a conforming product is judged to be a non-conforming product and is removed as a non-conforming chip due to this misrecognition. Therefore, in the process at step S106, semiconductor chips removed as non-conforming chips include semiconductor chips having electrical characteristics enabling use as a conforming product. In this manner, semiconductor chips that may be used as a conforming product are removed as non-conforming chips and therefore, a conforming product rate decreases, leading to increases in chip cost.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

While a method of manufacturing a silicon carbide semiconductor device according to a first embodiment, for example, is applicable to a Schottky barrier diode (SBD), a metal oxide semiconductor field effect transistor (MOSFET) having insulated gates with a 3-layered structure including a metal, an oxide film, and a semiconductor, etc., the method may be applied to a pin (p-intrinsic-n) diode and an insulated gate bipolar transistor (IGBT).

Figure 1:
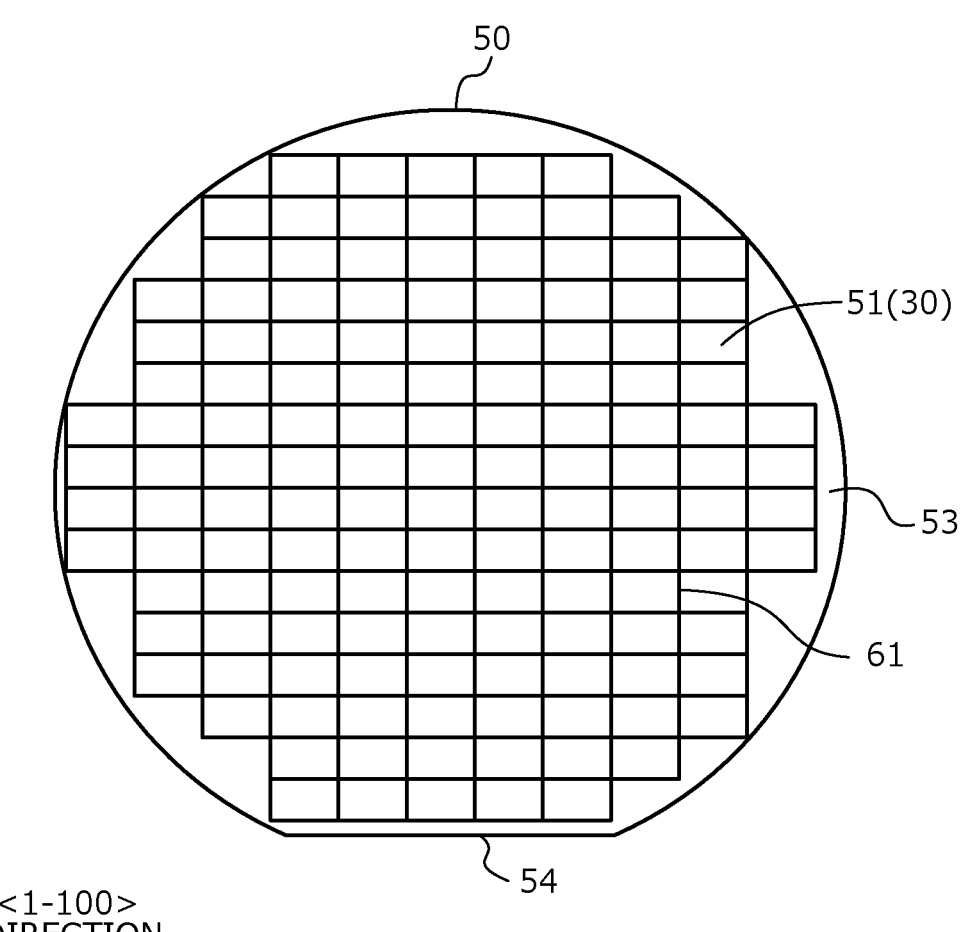
FIG. 1 is a plan view depicting a state when a semiconductor wafer manufactured by a method of manufacturing a silicon carbide semiconductor device according to an embodiment is viewed from a front side thereof.
Figure 1:
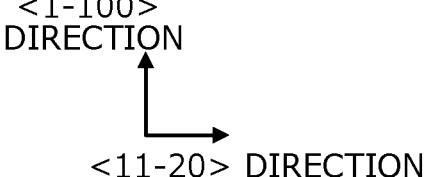
Figure 2:
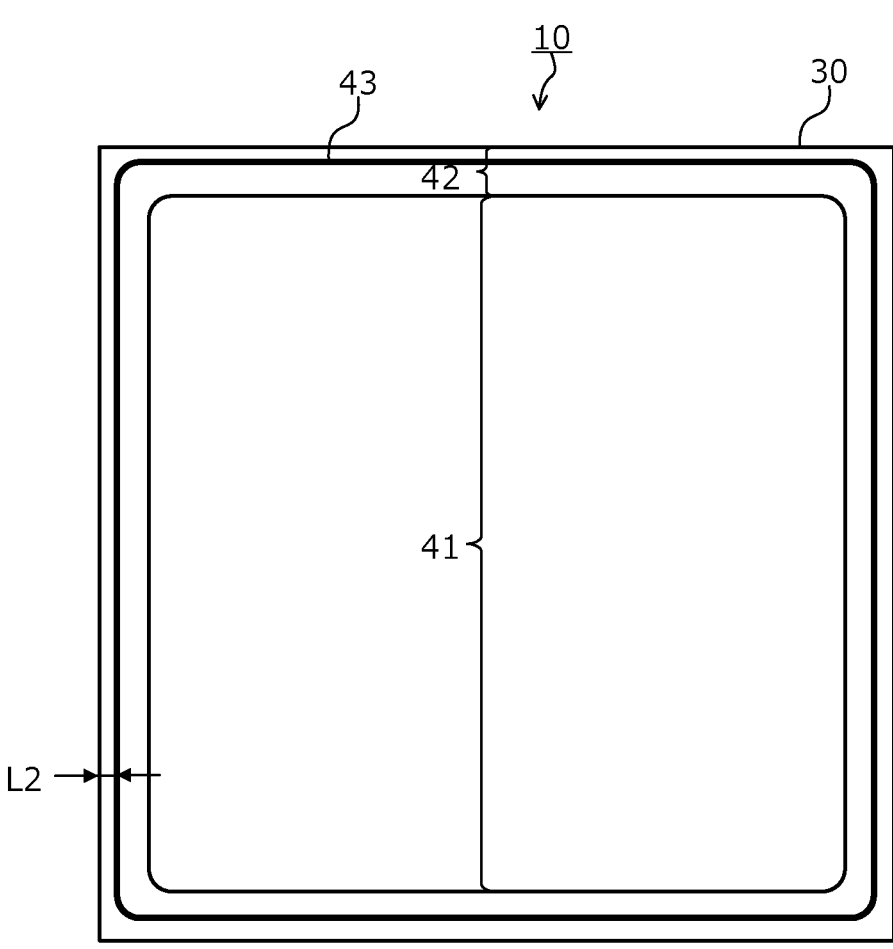
FIG. 2 is a plan view of a layout when a semiconductor chip cut from the semiconductor wafer in FIG. 1 is viewed from a front side thereof.
Figure 3:
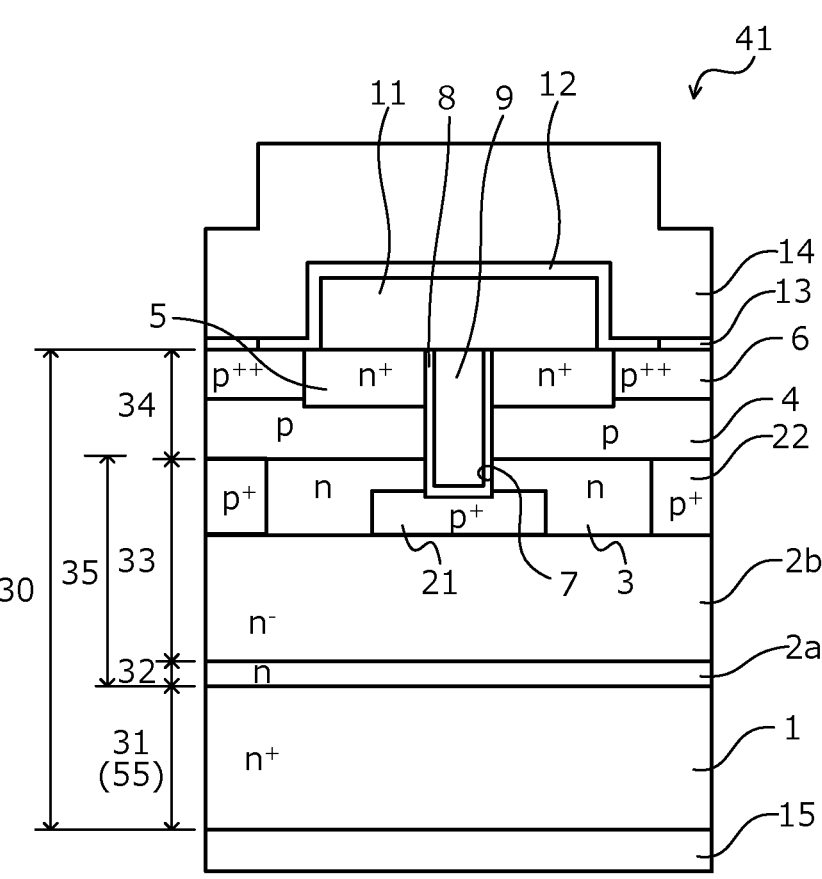
FIG. 3 is a cross-sectional view of a structure of the silicon carbide semiconductor device according to a first embodiment.

Here, as a silicon carbide semiconductor device manufactured (fabricated) using silicon carbide (SiC), an n-channel type vertical MOSFET having a trench gate structure is depicted. FIG. 1 is a plan view depicting a state when a semiconductor wafer manufactured by the method of manufacturing the silicon carbide semiconductor device according to the embodiment is viewed from a front side thereof. FIG. 2 is a plan view of a layout when a semiconductor chip cut from the semiconductor wafer in FIG. 1 is viewed from a front side thereof. FIG. 2 depicts a state of one chip region 51 of a semiconductor wafer 50 in FIG. 1 after dicing. FIG. 3 is a cross-sectional view of a structure of the silicon carbide semiconductor device according to the first embodiment.

The semiconductor wafer 50 is formed by epitaxially growing an epitaxial layer (refer to FIG. 3, portion constituting an epitaxial layer 35 in FIG. 3 after dicing) on an n⁺-type starting wafer (refer to FIG. 3, portion constituting an n⁺-type starting substrate 31 in FIG. 3 after dicing) containing silicon carbide.

The semiconductor wafer 50 may have, for example, an orientation flat (straight cutout provided at a portion of the edge) 54 or a notch (V-shaped cutout provided at a portion of the edge, not depicted) indicating plane orientation. The chip regions 51 of the semiconductor wafer 50 are cut (diced) along scribe lines 61 into the individual semiconductor chips 30. All the semiconductor chips 30 individually cut from the same semiconductor wafer 50 have the same epitaxial layer 35 and a p-type epitaxial layer 34 (refer to FIG. 3) and have the same device element structure (here, a trench gate structure, refer to FIG. 3) formed by the same processes.

Each of the chip regions 51 has a substantially rectangular shape in a plane view thereof, the chip regions being disposed in substantially a center of the semiconductor wafer 50 in a matrix-like pattern. The scribe lines 61 surround peripheries of the chip regions 51 in a grid-like pattern. The scribe lines 61 are linear shaped regions formed at a main surface of the semiconductor wafer 50 (surface of a portion thereof having an epitaxial layer 33 in FIG. 3). In the scribe lines 61, marks (refer to FIG. 5) for indicating positions (coordinates) in directions parallel to the surface of the semiconductor wafer 50 are formed. The marks are markers for indicating locations of the chip regions 51, locations of crystal defects detected by the process at step S3 in later-described FIG. 4, and the like.

The marks, for example, are protrusions or recesses having a predetermined shape (for example, an X-shape) in a plan view and are formed by etching at the main surface of the semiconductor wafer 50, in the scribe lines 61. Alignment marks for positioning (aligning) parts of the device element structure and formed in the chip regions 51 may be used as the marks.

A silicon carbide semiconductor device 10 according to the first embodiment depicted in FIG. 2 is an n-channel type vertical MOSFET having in an active region 41, a trench gate structure on a front side of the semiconductor chip 30 containing silicon carbide, for example, (0001)-plane (Si-face). The active region 41 is a region through which a main current (drift current) flows when the MOSFET in in an ON state and in which multiple unit cells (functional units of a device element) of the MOSFET and having the same structure are disposed adjacent to one another. In FIG. 3, one unit cell of the MOSFET is depicted. The active region 41, for example, is disposed in substantially a center of the semiconductor chip 30 and a periphery thereof is surrounded by an edge termination region 42.

The edge termination region 42 is a region between the active region 41 and an end of the semiconductor chip 30. The edge termination region 42 has a function of mitigating electric field of the front side of the semiconductor chip 30 and sustaining a withstand voltage. In the edge termination region 42, a voltage withstanding structure (not depicted) such as a field limiting ring (FLR), junction termination extension (JTE) structure, or a guard ring is disposed. The withstand voltage is a voltage limit at which leak current does not increase excessively and no erroneous operation or destruction of the silicon carbide semiconductor device 10 occurs.

The trench gate structure is configured by a p-type base region 4, n⁺-type source regions 5, p⁺⁺-type contact regions 6, trenches 7, a gate insulating film 8, and gate electrodes 9. The semiconductor chip 30 is formed by epitaxially growing sequentially on a front surface of the n⁺-type starting substrate 31 containing silicon carbide, epitaxial layers 32, 33, 34 constituting an n-type buffer region 2a, an n⁻-type drift region 2b, and the p-type base region 4. The semiconductor chip 30 has, as a front surface, a main surface of a portion thereof having the n⁺-type source regions 5 and, as a back surface, a main surface that is a surface of the n⁺-type starting substrate 31 (back surface of the n⁺-type starting substrate 31).

The n⁺-type starting substrate 31 constitutes an n⁺-type drain region 1. The n-type buffer region 2a has a function of preventing holes generated by a pn junction interface between the p-type base region 4 and the n⁻-type drift region 2b from reaching the n⁺-type starting substrate 31 by recombining the holes in the n-type buffer region 2a. Further, the n-type buffer region 2a has a function of suppressing expansion of stacking faults in the epitaxial layers 33, 34 due to propagation of dislocations from the n⁺-type starting substrate 31 to the epitaxial layer 35. The n-type buffer region 2a may be omitted.

The n⁻-type drift region 2b is provided between and in contact with the p-type base region 4 and the n-type buffer region 2a (in an instance in which the n-type buffer region 2a is omitted, the n⁺-type drain region 1). Between the p-type base region 4 and the n⁻-type drift region 2b, n-type current spreading regions 3 and p⁺-type regions 21, 22 may be provided. In this instance, the n-type drift region 2b is a portion of the n⁻-type epitaxial layer 33 excluding the n-type current spreading regions 3 and the p⁺-type regions 21, 22. The n-type current spreading regions 3 and the p⁺-type regions 21, 22 are provided at deep positions closer to the n⁺-type drain region 1 than are bottoms of the trenches 7.

The n-type current spreading regions 3 constitute a so-called current spreading layer (CSL) that reduces carrier spreading resistance. The p⁺-type regions 21, 22 have a function of mitigating electric field applied to the gate insulating film 8 at the bottoms of the trenches 7. The p⁺-type regions 21 are provided separately from the p-type base region 4 and face the bottoms of the trenches 7 in a depth direction, respectively. The p⁺-type regions 21 may be in contact with the bottoms of the trenches 7, respectively. One of the p⁺-type regions 22 is provided between an adjacent two of the trenches 7, separately from the trenches 7 and the p⁺-type regions 21, and in contact with the p-type base region 4.

The p-type base region 4 is provided between the front surface of the semiconductor chip 30 and the n⁻-type drift region 2b. The p-type base region 4 is a portion of the p-type epitaxial layer 34 excluding the n⁺-type source regions 5 and the p⁺⁺-type contact regions 6. The n⁺-type source regions 5 and the p⁺⁺-type contact regions 6 are selectively provided between the front surface of the semiconductor chip 30 and the p-type base region 4. The n⁺-type source regions 5 and the p⁺⁺-type contact regions 6 are in contact with the p-type base region 4 and are in ohmic contact with ohmic electrodes 13 in contact holes of a later-described interlayer insulating film 11.

The p⁺⁺-type contact regions 6 may be omitted. In an instance in which the p⁺⁺-type contact regions 6 are omitted, instead of the p⁺⁺-type contact regions 6, the p-type base region 4 are in ohmic contact with the ohmic electrodes 13. The n-type current spreading regions 3, the $p^+$-type regions 21, 22, the $n^+$-type source regions 5, and the $p^{++}$-type contact regions 6 are diffused regions formed by ion implantation and are selectively provided in the epitaxial layer 35. The trenches 7 penetrate through the $n^+$-type source regions 5 and the p-type base region 4 and reach the n-type current spreading regions 3 (in an instance in which the n-type current spreading regions 3 are omitted, the $n^-$-type drift region 2b).

In the trenches 7, the gate electrodes 9 are provided via the gate insulating film 8. The interlayer insulating film 11 is provided on the front surface of the semiconductor chip 30 and covers the gate electrodes 9. In an entire area between the interlayer insulating film 11 and a later-described front electrode 14, for example, a barrier metal 12 that prevents diffusion of metal atoms from the front electrode 14 to the gate electrodes 9 may be provided. The ohmic electrodes 13 are constituted by a silicide film provided on the front surface of the semiconductor chip 30, in the contact holes of the interlayer insulating film 11. The ohmic electrodes 13 are electrically connected to the p-type base region 4, the $n^+$-type source regions 5, and the $p^{++}$-type contact regions 6.

The front electrode 14 is provided in substantially an entire area of the front surface of the semiconductor chip 30, in the active region 41, so as to be embedded in the contact holes of the interlayer insulating film 11. The front electrode 14 is electrically connected to the p-type base region 4, the $n^+$-type source regions 5, and the $p^{++}$-type contact regions 6, via the ohmic electrodes 13. The barrier metal 12, the ohmic electrodes 13, and the front electrode 14 function as a source electrode. A back electrode 15 is provided in an entire area of the back surface of the semiconductor chip 30, for example, a <000-1>-plane (C-face) (back surface of the $n^+$-type starting substrate 31) and is electrically connected to the $n^+$-type drain region 1. The back electrode 15 functions as a drain electrode.

Next, the method of manufacturing the silicon carbide semiconductor device according to the first embodiment is described. FIG. 4 is a flowchart of an outline of the method of manufacturing the silicon carbide semiconductor device according to the first embodiment.

First, the semiconductor wafer (SiC wafer) 50 containing silicon carbide as a semiconductor material is formed (step S1: first process). The semiconductor wafer 50 is formed by epitaxially growing the epitaxial layer 35 on the $n^+$-type starting substrate 31. In the process at step S1, a starting wafer 55 containing silicon carbide may be prepared and the semiconductor wafer 50 may be fabricated, or the semiconductor wafer 50 itself may be purchased.

Next, marks are formed in the scribe lines on a main surface of the semiconductor wafer 50 (surface of a portion thereof having the epitaxial layer 35) (step S2: second process). The scribe lines are also called dicing lines and are linear shaped regions formed on a main surface of the semiconductor wafer 50 (surface of a portion thereof having the epitaxial layer 35 in FIG. 3), the scribe lines indicate cutting locations when the individual semiconductor chips are cut. For example, a width of the scribe lines is about 100 μm.

Next, an inspection is performed by the crystal defect inspection equipment, the type, size (length, area, etc.), and location information of crystal defects at the surface and in the epitaxial layer 35 of the semiconductor wafer 50 are detected and obtained (step S3: third process). The crystal defect inspection equipment, for example, is the SiC Wafer Inspection and Review System SICA88 manufactured by Lasertec Corporation. The crystal defects detected by the process at step S3 are foreign particle defects, triangular defects, and extended defects formed in an epitaxial layer. The size and location information of these crystal defects, for example, are obtained based on the marks formed by the process at step S2.

Figure 5:
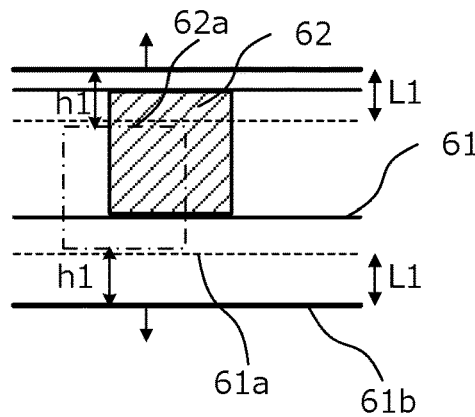
FIG. 5 is a top view of a scribe line of the semiconductor wafer according to the first embodiment and a scribe line recognized by crystal defect inspection equipment.

FIG. 5 is a top view of a scribe line of the semiconductor wafer according to the first embodiment and a scribe line recognized by the crystal defect inspection equipment. In FIG. 5, a scribe line 61 indicated by thin lines is a scribe line provided in the semiconductor wafer 50, a scribe line 61a indicated by dotted lines is a scribe line conventionally recognized by the crystal defect inspection equipment, and a scribe line 61b indicated by thick lines is a scribe line recognized by the crystal defect inspection equipment of the first embodiment (similarly in FIG. 6).

Here, a majority of the scribe line 61 is removed by dicing and since current does not pass through portions that are left, it is not problematic even when crystal defects are present in the scribe line 61. Therefore, the crystal defect inspection equipment is preset with the locations of the scribe lines 61 so that crystal defects in the scribe lines 61 are not inspected. The scribe lines 61a, 61b recognized by the crystal defect inspection equipment are locations of the scribe lines that are set in the crystal defect inspection equipment. Further, a mark 62a indicated by a dashed and dotted line is the location of a mark 62 provided in the scribe line 61 in an instance in which there is no misalignment of the scribe lines in the crystal defect inspection equipment.

In the first embodiment, a distance h1 between an edge of the scribe line 61b recognized by the crystal defect inspection equipment and an edge of the mark 62a is assumed to be in a range from 10 μm to 25 μm. The distance h1 between the edge of the scribe line 61b recognized by the crystal defect inspection equipment and the edge of the mark 62a is one half of a difference of a width of the scribe line 61b and a width of the mark 62. Here, a width of the scribe line 61a conventionally recognized by the crystal defect inspection equipment is the same as the width of the scribe lines 61 provided in the semiconductor wafer 50. In the first embodiment, the width of the scribe line 61b recognized by the crystal defect inspection equipment is wider than the width of the scribe lines 61 provided in the semiconductor wafer 50 and the distance h1 between the edge of the scribe line 61b recognized by the crystal defect inspection equipment and the edge of the mark 62a is assumed to be in a range from 10 μm to 25 μm.

For example, the scribe line 61b is increased in width on each side thereof by a widening amount L1 (in a direction orthogonal to the scribe line 61b) as indicated by arrows in FIG. 5, whereby the distance h1 from the edge of the scribe line 61b recognized by the crystal defect inspection equipment to the edge of the mark 62a is adjusted. The width of the scribe line 61b recognized by the crystal defect inspection equipment is changeable by the setting of the crystal defect inspection equipment. The distance h1 from the edge of the scribe line 61b recognized by the crystal defect inspection equipment to the edge of the mark 62a, for example, is in a range from 10 μm to 25 μm or preferably, may be in a range from 15 μm to 20 μm. These values are based on the misalignment between the scribe lines 61 provided in the semiconductor wafer 50 and the scribe lines 61b recognized by the crystal defect inspection equipment being at most 10 μm. Further, when the misalignment is greater than 25 μm, crystal defects that should be detected are not detected.

Here, in the silicon carbide semiconductor device, a channel stopper portion 43 is provided in an outermost periphery of the edge termination region 42 (refer to FIG. 2). Current does not pass through a portion on an outer side of the channel stopper portion 43 and therefore, even when crystal defects are present therein, device element characteristics such as ON voltage are not affected. Therefore, the location of the edge of the scribe line 61b recognized by the crystal defect inspection equipment may be widened up to the channel stopper portion 43. In this instance, the edge of the scribe line 61b recognized by the crystal defect inspection equipment is positioned at the channel stopper portion 43 of the semiconductor chip. Preferably, the widening amount L1 of the outer sides may be set to be at most a distance L2 from the chip end to an active-region-facing edge of the channel stopper portion 43 (the active-region-facing edge faces the active region 41) (refer to FIG. 2). The distance L2 includes a distance (not depicted) from the chip end to a chip-end-facing edge of the channel stopper portion 43 (the chip-end-facing edge faces the edge termination region 42) and a width of the channel stopper portion 43.

Accordingly, by increasing this distance and the width of the channel stopper portion 43, the distance L2 is increased, and the widening amount L1 of the outer sides may be increased.

In this manner, even when the scribe line 61b recognized by the crystal defect inspection equipment is not aligned with the scribe line 61 provided in the semiconductor wafer 50, the mark 62 is within the scribe line 61b recognized by the crystal defect inspection equipment. Therefore, misrecognition of the mark 62 as a crystal defect by the crystal defect inspection equipment may be eliminated.

Figure 6:
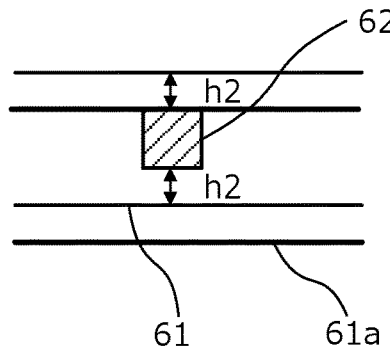
FIG. 6 is a top view of a mark in a scribe line of the semiconductor wafer according to the first embodiment.

Further, as for the scribe lines recognized by the crystal defect inspection equipment, the mark 62 may be made smaller with the conventional scribe lines 61a left as is. FIG. 6 is a top view of a mark in a scribe line of the semiconductor wafer according to the first embodiment. As depicted in FIG. 6, the mark 62 formed at step S2 is made smaller than the conventional size, whereby the size of the mark 62 may be made smaller than the width of the scribe line 61. In this manner, in the first embodiment, the width of the scribe line 61a recognized by the crystal defect inspection equipment becomes larger than the size of the mark 62.

For example, assuming a distance between the scribe line 61 and an edge of the mark 62 is h2, the mark 62 is set to have a size so that the mark 62 is at least the distance h2 on the inner side from the edges of the scribe line 61. For example, the distance h2 is at most 10 μm and therefore, the mark 62 is set to a size so that the mark 62 is on the inner side and at least 10 μm from the edges of the scribe line 61. Further, when the mark 62 is too small, alignment becomes difficult and therefore, preferably, the distance from the edges of the scribe lines 61 to the edges of the mark 62 may be set to be at most 25 μm.

In this manner, even when there is misalignment between the scribe lines 61 and the scribe lines 61a recognized by the crystal defect inspection equipment, the mark 62 in the scribe lines 61 is within the scribe lines 61a recognized by the crystal defect inspection equipment. Therefore, even in an instance in which the width of the scribe line 61a recognized by the crystal defect inspection equipment is the same as the width of the scribe lines 61 provided in the semiconductor wafer 50, cases in which the crystal defect inspection equipment misrecognizes the mark 62 as a crystal defect may be eliminated.

Figure 7:
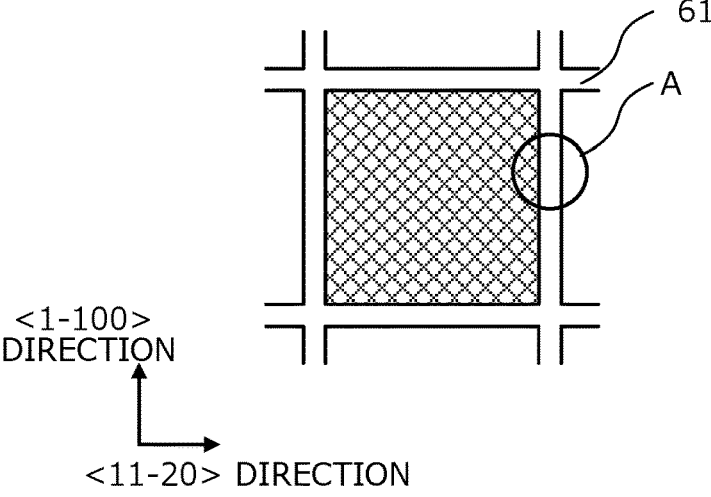
FIG. 7 is a top view depicting a location of the mark in a scribe line of the semiconductor wafer according to the first embodiment.
Figure 11:
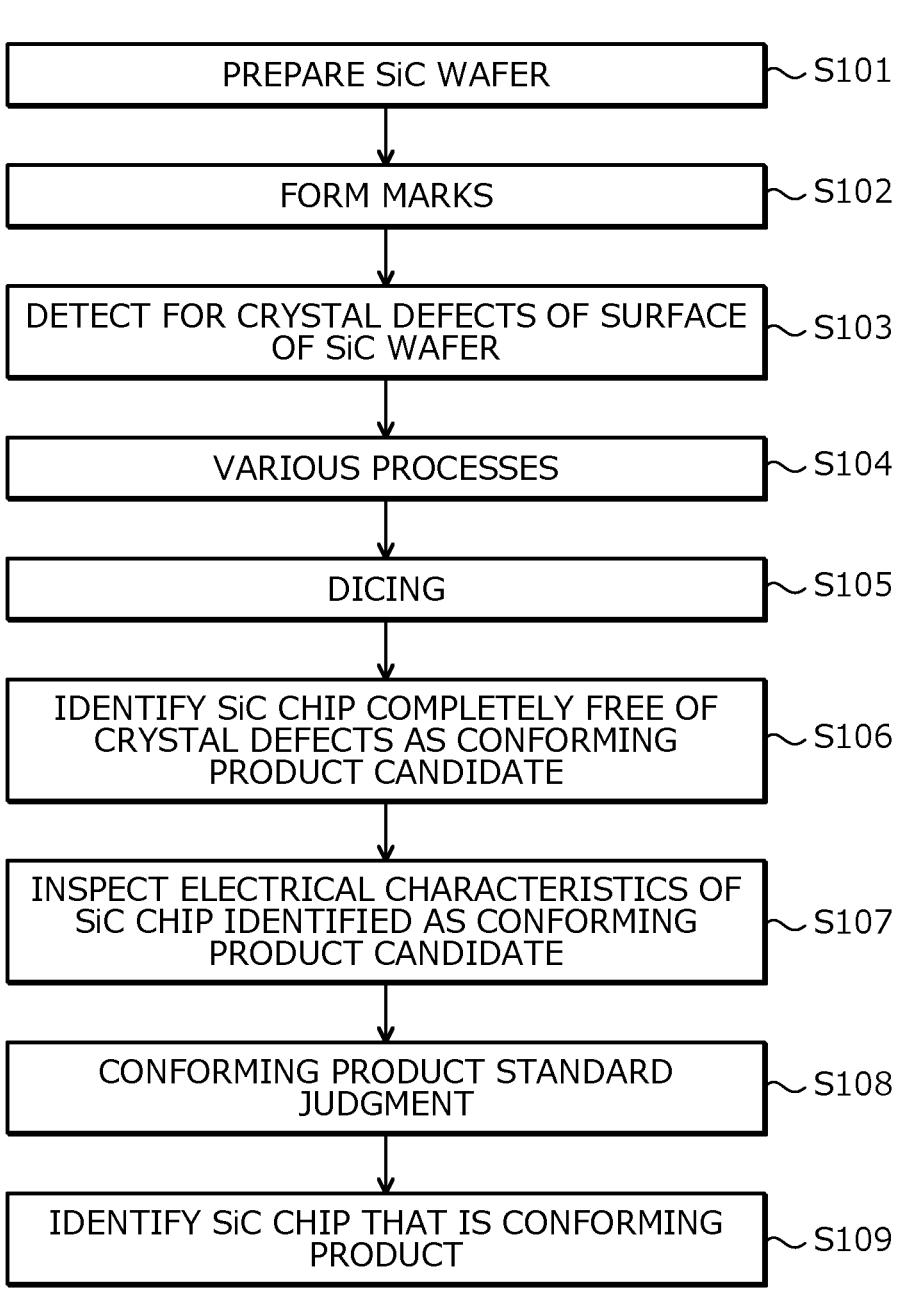
FIG. 11 is a flowchart of an outline of a method of manufacturing a conventional silicon carbide semiconductor device.

Further, FIG. 7 is a top view depicting a location of the mark in a scribe line of the semiconductor wafer according to the first embodiment. The scribe lines 61 are provided in an <11-20> direction in the direction of the orientation flat 54 and in a <1-100> direction orthogonal to the direction of the orientation flat 54. In the first embodiment, configuration may be such that the mark 62 is present only on the scribe lines 61 (region A in FIG. 7) that are in the <1-100> direction or the ratio present on the scribe lines 61 that are in the <1-100> direction may be increased.

Figure 8:
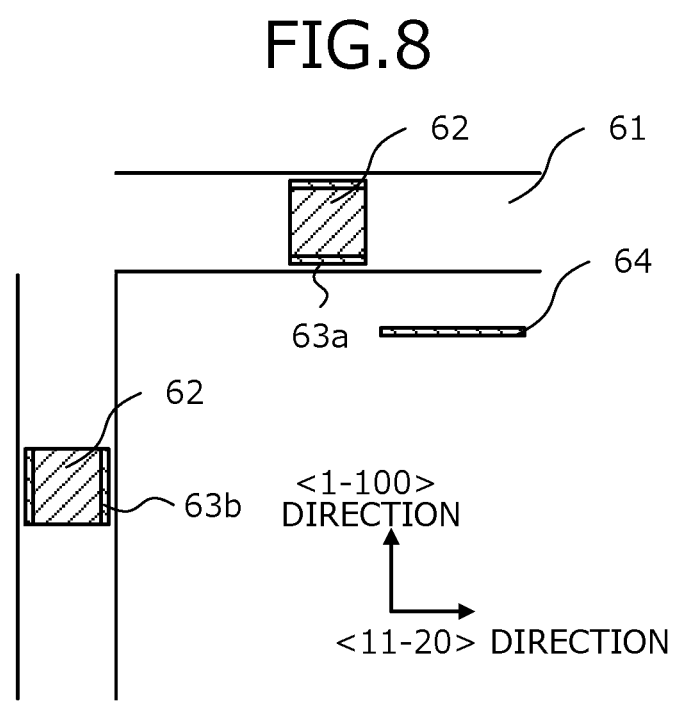

FIG. 8 is a top view of the mark in the scribe lines of the semiconductor wafer according to the first embodiment and a linear crystal defect. A linear crystal defect 64 grows linearly in the <11-20> direction, which is the direction of the orientation flat 54. Therefore, the crystal defect inspection equipment recognizes the rod-shape extended in the <11-20> direction as the linear crystal defect 64. Here, in an instance in which the scribe lines 61 in the <11-20> direction and the scribe lines 61b recognized by the crystal defect inspection equipment are misaligned, a mark edge-portion 63a has a rod-shape extended in the <11-20> direction. This shape resembles the linear crystal defect 64 and therefore, the crystal defect inspection equipment misrecognizes the mark edge-portion 63a as the linear crystal defect 64. On the other hand, in an instance in which the scribe lines 61 that are in the <1-100> direction and the scribe lines 61b recognized by the crystal defect inspection equipment are misaligned, a mark edge-portion 63b has a rod-shape extended in the <1-100> direction and thus, the shape is different from that of the linear crystal defect 64 and the crystal defect inspection equipment does not recognize the mark edge-portion 63b as a linear crystal defect.

Therefore, by placing the mark 62 only on the scribe lines 61 that are in the <1-100> direction (region A in FIG. 7) or by increasing the ratio present on the scribe lines 61 that are in the <1-100> direction, misrecognition of the mark 62 as a crystal defect by the crystal defect inspection equipment may be reduced. Here, a configuration in which the mark 62 is provided only on the scribe lines 61 that are in the <1-100> direction includes a configuration in which the mark 62 is provided at an intersection of the scribe lines 61 of the <11-20> direction and the scribe lines 61 of the <1-100> direction.

In this manner, the mark 62 in the scribe lines 61 of the <1-100> direction is not misrecognized as a crystal defect and therefore, as depicted in FIG. 5, widening of the width of the scribe lines 61b recognized by the crystal defect inspection equipment is unnecessary. For example, in an instance in which the width thereof made wider than the width of the scribe lines 61 provided in the semiconductor wafer 50, only the width of the scribe lines 61b recognized by the crystal defect inspection equipment in the <11-20> direction may be increased to be wider than the width of the scribe lines 61 provided in the semiconductor wafer 50.

Further, when the width of the scribe lines 61b recognized by the crystal defect inspection equipment are made larger than the size of the mark 62, this may be combined with placing the mark 62 only on the scribe lines 61 that are in the <1-100> direction or increasing the ratio present on the scribe lines 61 that are in the <1-100> direction. For example, when the mark 62 has been set to a size that is at most one half the size conventionally, the mark 62 may be disposed on the scribe lines 61 that are in the <1-100> direction only.

Further, while the mark 62 has a square-shape as depicted in FIG. 5, etc., by setting the shape to be one without a line parallel to the scribe lines 61 such as a rhombus, erroneous detection by the crystal defect inspection equipment may be further reduced.

Next, various processes for forming a predetermined device element structure (refer to FIG. 3) in the chip regions of the semiconductor wafer 50 are performed (step S4: fourth process). Details of the various processes are shown below. First, the n-type epitaxial layer 32, the n⁻-type epitaxial layer 33, and the n-type current spreading regions 3 are selectively formed as the epitaxial layer 35 by epitaxial growth. Next, the p⁺-type regions 21, 22 are selectively formed in the n-type current spreading regions 3 by photolithography and ion implantation. The n-type current spreading regions 3 and the p⁺-type regions 22 may be formed by multiple sessions of epitaxial growth and ion implantation.

Next, the p-type base region 4 doped with a p-type impurity such as aluminum is epitaxially grown on surfaces of the n-type current spreading regions 3. Next, a process including formation of an ion implantation mask by photolithography and etching, ion implantation using the ion implantation mask, and removal of the ion implantation mask as one set is repeatedly performed under different ion implantation conditions, whereby the n⁺-type source regions 5 and the p⁺⁺-type contact regions 6 are formed in the p-type base region 4 at the surface thereof.

Next, a heat treatment (annealing) is performed and, for example, the p⁺-type regions 21, 22, the n⁺-type source regions 5, and the p⁺⁺-type contact regions 6 are activated. As described above, ion implanted regions may be collectively activated by a single session of the heat treatment or may be activated by performing the heat treatment each time ion implantation is performed.

Next, from the surface of the p-type base region 4 (i.e., surfaces of the n⁺-type source regions 5 and the p⁺⁺-type contact regions 6), the trenches 7 that penetrate through the n⁺-type source regions 5 and the p-type base region 4 and reach the n-type current spreading regions 3 are formed by photolithography and etching. The bottoms of the trenches 7 reach the p⁺-type regions 21.

Next, the gate insulating film 8 is formed along the surfaces of the n⁺-type source regions 5 and the p⁺⁺-type contact regions 6 and along the bottoms and sidewalls of the trenches 7. Next, on the gate insulating film 8, for example, a polycrystalline silicon layer doped with phosphorus atoms (P) is formed. The polycrystalline silicon layer is formed so as to be embedded in the trenches 7. The polycrystalline silicon layer is patterned and left in the trenches 7, whereby the gate electrodes 9 are formed.

Next, the interlayer insulating film 11 is formed so as to cover the gate insulating film 8 and the gate electrodes 9. The interlayer insulating film 11 and the gate insulating film 8 are patterned and selectively removed, whereby contact holes are formed and the n⁺-type source regions 5 and the p⁺⁺-type contact regions 6 are exposed. Thereafter, a heat treatment (reflow) is performed, thereby planarizing the interlayer insulating film 11.

Subsequently, in the contact holes and on the interlayer insulating film 11, a conductive film constituting the ohmic electrodes 13 is formed. The conductive film is selectively removed and, for example, is left only in the contact holes as the ohmic electrodes 13.

Subsequently, the back electrode 15 is formed on the back surface of the n⁺-type drain region 1. Next, the front electrode 14 is formed, for example, by a sputtering method, so as to cover the ohmic electrodes 13 and the interlayer insulating film 11. Further, the barrier metal 12 may be formed between the front electrode 14 and the interlayer insulating film 11. By the processes above, a predetermined device element structure is formed in each of the chip regions.

Next, the semiconductor wafer 50 is cut (diced), whereby the chip regions of the semiconductor wafer 50 become the individual semiconductor chips 30 (step S5: fifth process). Next, based on information obtained by the process at step S3, it is determined whether a crystal defect has been detected by the inspection performed by the crystal defect inspection equipment (step S6: sixth process). When a chip is free of crystal defects, normal is determined (step S6: NO). When a crystal defect is contained, abnormal is determined (step S6: YES), and the chip is discarded as a non-conforming chip (step S9).

Next, for each semiconductor chip free of crystal defects at the process at step S6, a predetermined conduction test is performed and electrical characteristics are inspected (step S7). At step S7, by a process at later-described step S8, for comparison with a conforming product standard, the conduction test when the conforming product standard was obtained is performed and electrical characteristics are obtained. A conforming product standard is a limit value (upper limit value, lower limit value, or both) of various characteristics capable of ensuring a predetermined capability and a predetermined reliability of the silicon carbide semiconductor device 10, and is set by the strictest conditions of all results obtained by performing, as preliminary tests, at least one test for measuring electrical characteristics for capability evaluation and at least one test for reliability evaluation, for example.

In an instance in which a conforming product standard is set by a leak current value (a reverse recovery current Ir in an instance of a SBD, a current value of a drain current Idss in an instance of the MOSFET), electrical characteristics for the capability evaluation are, for example, forward surge current capability (IFSM capability), reverse recovery capability, avalanche capability, reverse bias safety operation area (RBSOA), and short circuit safe operation area (SCSOA). In this instance, an upper limit of the conforming product standard is the leak current value for the rating.

Further, in an instance in which the conforming product standard is set by a leak current value, the electrical characteristics for evaluating capability evaluation such as, for example, the forward surge current capability during continuous conduction, continuous conduction life span, reverse recovery capability during continuous conduction, avalanche capability during continuous conduction, RBSOA during continuous conduction, and SCSOA during continuous conduction. In this instance, the conforming product standard is a range relative to the leak current value when an amount of fluctuation from a design value of these electrical characteristics is at most a predetermined ratio (for example, 20%). Further, in the MOSFET, when the conforming product standard is set by a leak current value, the electrical characteristics for evaluating capability are the dielectric breakdown capability of the gate insulating films.

The dielectric breakdown capability of the gate insulating films, for example, is time zero dielectric breakdown (TZDB) capability, time dependent dielectric breakdown (TDDB) capability due to application of gate voltage while the drain and source are grounded, and time dependent dielectric breakdown (DTDDB) capability due to application of gate voltage and application of a predetermined voltage (for example, 1200V) to the drain while the source is grounded. In this instance, the conforming product standard is a range from a leak current value (value of drain current Idss) when the amount of fluctuation from a design value of the dielectric breakdown capability of the gate insulating films 8 is at most a predetermined ratio (for example, 20%).

Further, in an instance in which the conforming product standard is set by a leak current value, a test for evaluating reliability, for example, is a high temperature and high voltage application test that evaluates electrical characteristics by applying high voltage under a high temperature; a high temperature, high humidity, high voltage application test that evaluates electrical characteristics by applying high voltage under a high temperature and high humidity; a power cycle test that evaluates operating life span due to thermal fatigue by intermittently conducting to repeatedly alternate between self-heating and cooling: and a low temperature and high voltage application test that evaluates electrical characteristics by applying high voltage under a low temperature. In this instance, the conforming product standard is a range from a leak current value when the amount of fluctuation from a design value of the electrical characteristics obtained by these tests is at most a predetermined ratio (for example, 20%).

Here, while not described, other than the tests for evaluating capability and evaluating reliability described above, other types of tests are performed to confirm or evaluate conditions that do not affect capability. These other tests, in an instance in which no trouble occurs even when performed in a state of the semiconductor wafer 50, may be performed at a timing after the process at step S5 but before the process at step S6, or may be performed to the semiconductor chips 30 after the process at step S6. At step S7, a test that is difficult to perform in the state of the semiconductor wafer 50 or a test that takes time when performed in the state of the semiconductor wafer 50 such as in an instance in which heating or cooling is performed until a predetermined temperature is reached suffices to be performed.

Next, based on the results at step S7 and the conforming product standard obtained in advance, a standard judgment of the semiconductor chips 30 that are conforming product candidates is performed (step S8). In the process at step S8, one conforming product standard is applied to all the semiconductor chips 30 that are conforming product candidates. Thus, manufacture of the silicon carbide semiconductor device 10 is complete.

As described above, according to the first embodiment, the distance between an edge of a scribe line recognized by the crystal defect inspection equipment and an edge of a mark is set to be in a range from 10 μm to 25 μm. For example, the width of the scribe lines recognized by the crystal defect inspection equipment is made wider than the width of the scribe lines provided in the semiconductor wafer. For example, the size of the mark is made smaller than the width of the scribe lines provided in the semiconductor wafer. Further, the mark is placed only on the scribe lines that are in the <1-100> direction or the ratio present on the scribe lines that are in the <1-100> direction is increased. As a result, even when the scribe lines recognized by the crystal defect inspection equipment are misaligned with the scribe lines provided in the semiconductor wafer, instances in which the crystal defect inspection equipment misrecognizes the mark as a crystal defect and the semiconductor chip containing this detected crystal defect is removed as a non-conforming chip are eliminated. In this manner, semiconductor chips conventionally set as non-conforming products due to over-detection may be used as a conforming product, whereby the conforming product rate may be enhanced and accordingly, chip cost may be reduced.

A structure of a silicon carbide semiconductor device according to a second embodiment is the same as that of the first embodiment (FIG. 3) and therefore, description thereof is omitted hereinafter. Further, step S2 and step S3 of a method of manufacturing the silicon carbide semiconductor device according to the second embodiment differ from those in the flowchart of the method of manufacturing the silicon carbide semiconductor device according to the first embodiment (FIG. 4). Therefore, only step S2 and step S3 are described.

Figure 9:
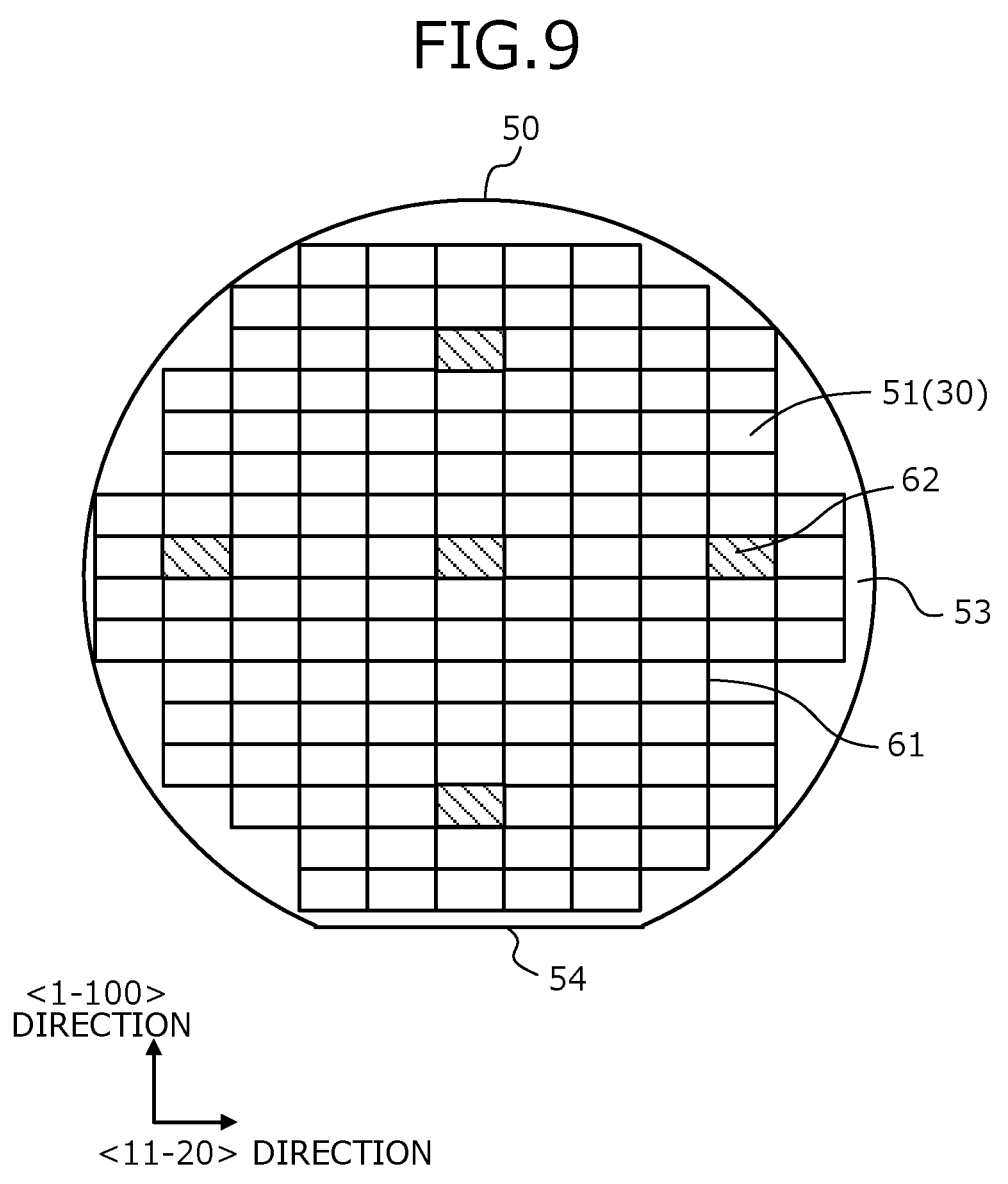
Figure 10:
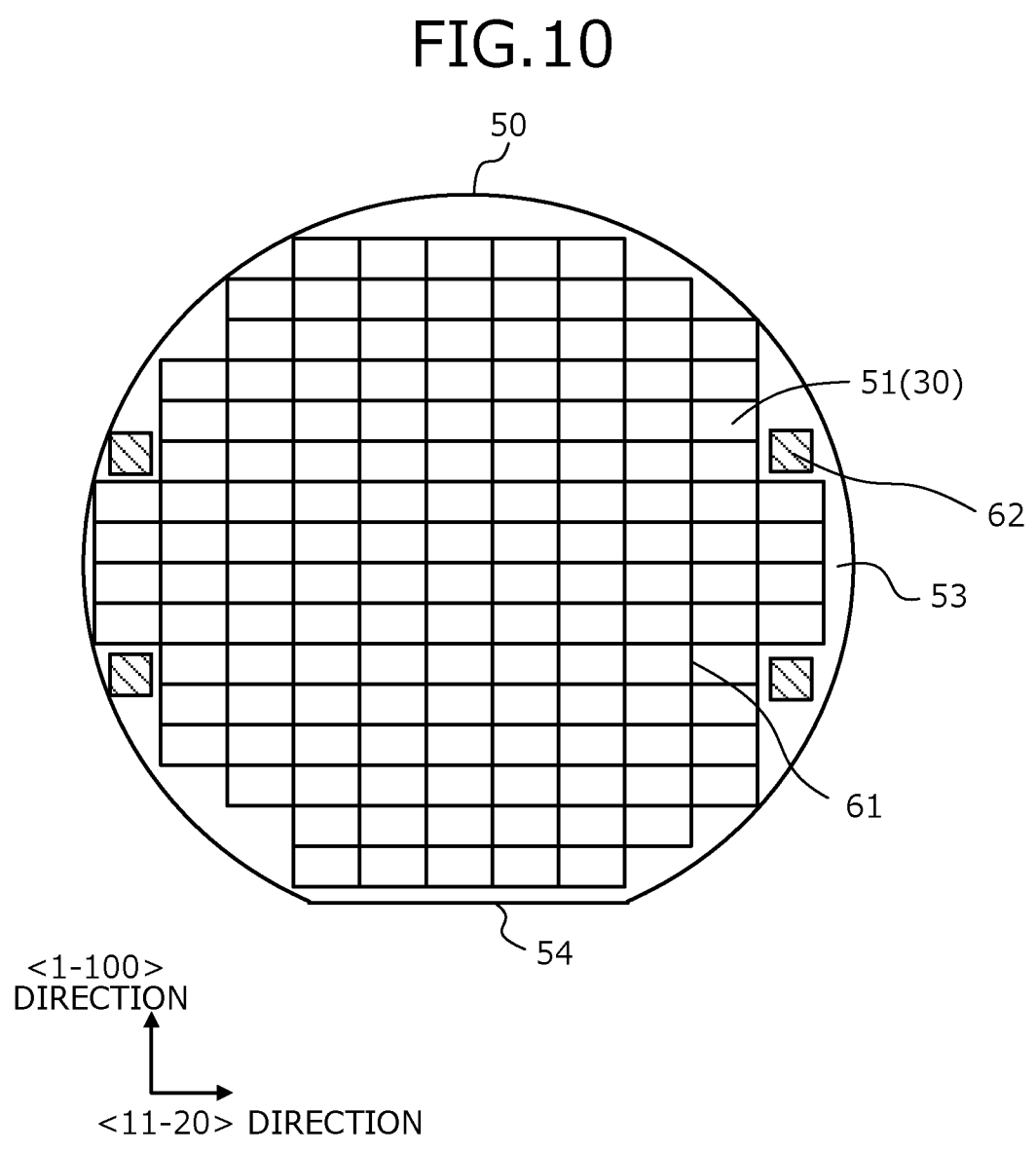

In the second embodiment, at step S2, the mark 62 is formed in a dedicated chip-disposal-region or a dead region 53 of a main surface of the semiconductor wafer 50 (surface of a portion thereof having the epitaxial layer 35). FIGS. 9 and 10 are top views of locations of the marks in the semiconductor wafer according to the second embodiment. As depicted in FIGS. 9 and 10, in the second embodiment, the mark 62 is disposed is regions other than those within the scribe lines 6. In other words, the mark 62 is not disposed within the scribe lines 61.

FIG. 9 is a top view in an instance in which the mark 62 is disposed in a dedicated chip-disposal-region. Here, a dedicated chip-disposal-region is a region that, of the chip regions of the semiconductor wafer 50, does not constitute the semiconductor chips 30 and in which the mark 62 is formed. The mark 62 is used in alignment and therefore, is disposed in at least 3 locations or preferably in 5 locations. In FIG. 9, while the mark 62 is disposed in a cross-shape, the mark 62 may be disposed in another shape such as a tetragon-shape.

Further, on the semiconductor wafer 50, to perform management, checking, or inspection in each process of the manufacturing process of the device, a process control monitor (PCM) is formed at a surface of the wafer forming the device. A region in which the PCM is formed (PCM chip) is not one of the semiconductor chips 30 constituting a product and therefore, preferably, the dedicated chip-disposal-region may be used for the PCM chip. In this manner, a decrease in the number of the semiconductor chips 30 manufactured from the semiconductor wafer is eliminated by the dedicated chip-disposal-region.

Here, in an instance of disposal in the dedicated chip-disposal-region, the crystal defect inspection equipment is set so as to not inspect the dedicated chip-disposal-region, whereby configuration may be such that the crystal defect inspection equipment does not recognize the mark 62 as a crystal defect. Further, in an instance of disposal in the PCM chip, while the crystal defect inspection equipment recognizes the mark 62 as a crystal defect, this is not problematic because the PCM chip is used to detect product characteristics and does not become a product.

FIG. 10 is a top view in an instance in which the mark 62 is disposed in the dead region 53. The dead region 53 is a portion of the semiconductor wafer 50, between an end of the semiconductor wafer 50 and the chip regions 51 that face the end of the semiconductor wafer 50 and is not used as the semiconductor chips 30. By disposing the mark 62 in the dead region 53, a decrease in the number of the semiconductor chips 30 manufactured from the semiconductor wafer 50 is eliminated. Further, the dedicated chip-disposal-region in the chip regions 5 and the dead region 53 of the outer periphery combined, for example, may be disposed in an X-shape. Nonetheless, in an instance of disposal in the dead region 53 in the outer periphery of the wafer, it is necessary that the mark 62 is not too far outward.

In this manner, in the second embodiment, the mark 62 is formed in the dedicated chip-disposal-region or in the dead region 53. Therefore, even when the scribe lines 61a recognized by the crystal defect inspection equipment are misaligned with the scribe lines 61 provided in the semiconductor wafer 50, the mark 62 is not misrecognized as a crystal defect. Therefore, instances in which the crystal defect inspection equipment misrecognizes the mark 62 as a crystal defect and the corresponding chip is removed as a non-conforming chip are eliminated and chips conventionally set as non-conforming products due to over-detection may be used as a conforming product, whereby the conforming product rate may be enhanced and accordingly chip cost may be reduced.

Further, in the second embodiment, inspection may be performed by the crystal defect inspection equipment without changing the width of the scribe line 61a recognized by the crystal defect inspection equipment at step S2. A reason for this is that the mark 62 is not present in the scribe lines 61. Therefore, it is unnecessary to change the width of the scribe line 61a recognized by the crystal defect inspection equipment and application is possible to crystal defect inspection equipment that cannot change this width by setting.

As described above, according to the second embodiment, the mark is formed in dedicated chip-disposal-region or dead region of the main surface of the semiconductor wafer. As a result, even when the scribe lines recognized by the crystal defect inspection equipment are misaligned with the scribe lines provided in the semiconductor wafer, instances in which the crystal defect inspection equipment misrecognizes the mark as a crystal defect and the corresponding chip is removed as a non-conforming chip are eliminated and chips conventionally set as non-conforming products due to over-detection may be used as a conforming product, whereby the conforming product rate may be enhanced and accordingly chip cost may be reduced.

The SICA System was used as the crystal defect inspection equipment and visual inspection of the chips judged to have a crystal defect present revealed that about 30% of the chips were free of crystal defects. These chips were chips in which the SICA System misrecognized the mark as a linear crystal defect. Therefore, in the method of manufacturing according to the embodiments, misrecognition by the SICA System may be substantially eliminated and therefore, about 30% of the chips judged to be non-conforming by the SICA System may be set as a conforming product and the conforming product rate may be enhanced.

In the foregoing, the present invention may be variously modified within a range not departing from the spirit of the invention and in the embodiments described above, for example, dimensions, impurity concentrations, etc. of parts are variously set according to necessary specifications. Further, in the embodiments described above, while a MOSFET is described as an example, the embodiments are further applicable to a SBD. Further, in the embodiments described above, while an instance of SiC is described, the embodiments are further applicable to GaN. Further, in the embodiments, while a first conductivity type is assumed to be an n-type and a second conductivity type is assumed to be a p-type, the present invention is similarly implemented when the first conductivity type is a p-type and the second conductivity type is an n-type.

According to the invention described above, the distance between an edge of a scribe line recognized by the crystal defect inspection equipment and an edge of a mark is set to be in a range from 10 μm to 25 μm. For example, the width of the scribe lines recognized by the crystal defect inspection equipment is made wider than the width of the scribe lines provided in the semiconductor wafer. For example, the size of the mark is made smaller than the width of the scribe lines provided in the semiconductor wafer. Further, the mark is placed only on the scribe lines that are in the <1-100> direction or the ratio present on the scribe lines that are in the <1-100> direction is increased. As a result, even when the scribe lines recognized by the crystal defect inspection equipment are misaligned with the scribe lines provided in the semiconductor wafer, instances in which the crystal defect inspection equipment misrecognizes the mark as a crystal defect and the semiconductor chip containing this detected crystal defect is removed as a non-conforming chip are eliminated. In this manner, semiconductor chips conventionally set as non-conforming products due to over-detection may be used as a conforming product, whereby the conforming product rate may be enhanced and accordingly, chip cost may be reduced.

The method of manufacturing a silicon carbide semiconductor device according to the present invention achieves an effect in that the conforming product rate may be increased and chip cost may be reduced.

As described, the method of manufacturing a silicon carbide semiconductor device according to the present invention is useful in instances in which semiconductor chips (silicon carbide semiconductor devices) are mass produced from a 6-inch semiconductor wafer and is particularly suitable for the manufacture of SBDs and MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:
    providing a starting substrate containing silicon carbide;
    epitaxially growing an epitaxial layer on the starting substrate, thereby forming a semiconductor wafer;
    forming a plurality of scribe lines, which include a first scribe line, in the epitaxial layer, to thereby delineate a plurality of chip regions;
    forming a mark in the first scribe line;
    inspecting the epitaxial layer for a crystal defect using crystal defect inspection equipment, the crystal defect inspection equipment recognizing the plurality of scribe lines to be a plurality of recognized scribe lines, including recognizing the first scribe line to be a recognized first scribe line;
    forming a device element structure in at least one of the plurality of chip regions in the semiconductor wafer;
    dicing the semiconductor wafer into a plurality of individual semiconductor chips along the plurality of scribe lines, after the device element structure is formed; and
    identifying, as a conforming product candidate, one of the plurality of semiconductor chips that is free of the crystal defect detected during the inspecting, wherein
    a distance between an edge of the recognized first scribe line and an edge of the mark, when the recognized first scribe line and the first scribe line are aligned, is in a range from 10 μm to 25 μm.

2. The method according to claim 1, wherein
    the recognized first scribe line has a width that is greater than a width of the first scribe line.

3. The method according to claim 2, wherein
    each of the semiconductor chips has a channel stopper portion, and
    the edge of the recognized first scribe line is positioned in the channel stopper portion of one of the semiconductor chips.

4. The method according to claim 1, wherein
the recognized first scribe line and the first scribe line
have a same width.

5. The method according to claim 1, wherein
the plurality of scribe lines, and accordingly the plurality
of recognized scribe lines, are provided in a <11-20>
direction and a <1-100> direction, in a gride-like
pattern, and
the recognized first scribe line is in the <11-20> direction.

6. A method of manufacturing a silicon carbide semicon-
ductor device, the method comprising:
providing a starting substrate containing silicon carbide;
epitaxially growing an epitaxial layer on the starting
substrate, thereby forming a semiconductor wafer;
forming a plurality of scribe lines, in a <11-20> direction
and a <1-100> direction in a grid-like pattern, to
thereby delineate a plurality of chip regions
forming a mark in only one of the plurality of scribe lines
in the <1-100> direction;
inspecting the epitaxial layer for a crystal defect using
crystal defect inspection equipment;
forming a device element structure in at least one of the
plurality of chip regions in the semiconductor wafer;
dicing the semiconductor wafer into a plurality of indi-
vidual semiconductor chips along the plurality of scribe
lines, after the device element structure is formed; and
identifying, as a conforming product candidate, one of the
plurality of semiconductor chips that is free of the
crystal defect detected during the inspecting.

\* \* \* \* \*